(12) United States Patent
Pyeon

(10) Patent No.: US 8,526,227 B2
(45) Date of Patent: Sep. 3, 2013

(54) PHASE CHANGE MEMORY WORD LINE DRIVER

(75) Inventor: Hong Beom Pyeon, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 213 days.

(21) Appl. No.: 13/110,399

(22) Filed: May 18, 2011

(65) Prior Publication Data

US 2011/0317482 A1 Dec. 29, 2011

Related U.S. Application Data

(60) Provisional application No. 61/357,724, filed on Jun. 23, 2010.

(51) Int. Cl.
*G11C 11/00* (2006.01)

(52) U.S. Cl.
USPC .. 365/163; 365/148; 365/185.23; 365/230.06

(58) Field of Classification Search
USPC .................... 365/163, 148, 185.25, 230.06
See application file for complete search history.

(56) References Cited

U.S. PATENT DOCUMENTS

| | | | |
|---|---|---|---|
| 7,436,693 B2 | 10/2008 | Kang et al. | |
| 7,436,711 B2 | 10/2008 | Cho et al. | |
| 7,447,092 B2 | 11/2008 | Cho et al. | |
| 7,450,414 B2 | 11/2008 | Scheuerlein | |
| 7,457,151 B2 | 11/2008 | Cho et al. | |
| 7,463,511 B2 | 12/2008 | Choi et al. | |
| 7,480,167 B2 | 1/2009 | Ahn | |
| 7,499,306 B2 | 3/2009 | Choi et al. | |
| 7,499,316 B2 | 3/2009 | Choi et al. | |
| 7,502,251 B2 | 3/2009 | Choi et al. | |
| 7,515,459 B2 | 4/2009 | Kang et al. | |
| 7,529,125 B2 | 5/2009 | Ohshima | |
| 7,535,747 B2 | 5/2009 | Lee et al. | |
| 7,995,372 B2 * | 8/2011 | Toda | 365/148 |
| 8,134,861 B2 * | 3/2012 | Nakadai | 365/154 |
| 2004/0027907 A1 * | 2/2004 | Ooishi | 365/226 |
| 2006/0209616 A1 | 9/2006 | Kim et al. | |
| 2007/0242503 A1 | 10/2007 | Choi et al. | |
| 2009/0097306 A1 | 4/2009 | Park et al. | |

FOREIGN PATENT DOCUMENTS

CA 2384862 A1 3/2001

OTHER PUBLICATIONS

International Search Report for PCT/CA2011/050136 on Jun. 3, 2011, 6 pages.
Kang et al., "A 0.1um 1.8V 256Mb 66MHz Synchronous Burst PRAM," ISSCC Dig. Tech. Paper, Feb. 2006; 10 pgs.
Lee et al., "A 90 nm 1.8 V 512 Mb Diode-Switch PRAM With 266 MB/s Read Throughput," IEEE J. Solid-State Circuits, vol. 43, No. 1, pp. 150-162, Jan. 2008; 13 pgs.

(Continued)

Primary Examiner — Toan Le
(74) Attorney, Agent, or Firm — Harvey Auerback

(57) ABSTRACT

A method for improving sub-word line response comprises generating a variable substrate bias determined by at least one user parameter. The variable substrate bias is applied to a sub-word line driver in a selected sub-block of a memory. A voltage disturbance on a sub-word line in communication with the sub-word line driver is minimized by modifying a variable substrate bias of the sub-word line driver to change a transconductance of the sub-word line driver thereby.

20 Claims, 8 Drawing Sheets

(56) References Cited

OTHER PUBLICATIONS

Oh et al., "Enhancd Write Performance of a 64-Mb Phase-Change Random Access Memory," IEEE J. Solid-State Circuits, vol. 41, No 1, pp. 122-126, Jan. 2006; 5 pgs.

Miyazaki et al., "A 1000-MIPS/W Microprocessor using Speed-Adaptive Threshold-Voltage CMOS with Forward Bias," 2000 IEEE International Soili-State Circuits Conference, 07803-5853-9/00, Session WP 25.6, 2000; 3 pgs.

* cited by examiner

PHASE CHANGE MEMORY WORD LINE DRIVER

CROSS-REFERENCE TO RELATED APPLICATIONS

This application is a utility application claiming priority to U.S. Provisional Application Ser. No. 61/357,724 filed on Jun. 23, 2010 entitled "PHASE PCM CELL WORD LINE DRIVER CONSISTING OF NMOS WITH VARIABLE VT," the entirety of which is incorporated by reference herein.

FIELD OF THE INVENTION

The invention relates generally to a phase change memory (PCM). More specifically, the invention relates to PCM word line driver.

BACKGROUND

Phase change memory (PCM) devices store data using phase change materials, such as Chalcogenide, which are capable of stably transitioning between amorphous and crystalline phases. The amorphous and crystalline phases (or states) exhibit different resistance values used to distinguish different logic states of memory cells in the memory devices. In particular, the amorphous phase exhibits a relatively high resistance and the crystalline phase exhibits a relatively low resistance.

At least one type of phase change memory device, called PRAM, uses the amorphous state to represent a logical '1' and the crystalline state to represent a logical '0'. In a PRAM device, the crystalline state is referred to as a "SET state" and the amorphous state is referred to as a "RESET state". Accordingly, a memory cell in a PRAM stores a logical '0' by setting a phase change material in the memory cell to the crystalline state, and the memory cell stores a logical '1' by setting the phase change material to the amorphous state.

The phase change material in a PRAM is converted to the amorphous state by heating the material to a first temperature above a predetermined melting temperature and then quickly cooling the material. The phase change material is converted to the crystalline state by heating the material at a second temperature lower than the melting temperature but above a crystallizing temperature for a sustained period of time. Accordingly, data is programmed to memory cells in a PRAM by converting the phase change material in memory cells of the PRAM between the amorphous and crystalline states using heating and cooling as described above.

The phase change material in a PRAM typically comprises a compound including germanium (Ge), antimony (Sb), and tellurium (Te), (i.e. a "GST" compound). The GST compound is well suited for a PRAM because it can quickly transition between the amorphous and crystalline states by heating and cooling. In addition to, or as an alternative for the GST compound, a variety of other compounds can be used in the phase change material. Examples of the other compounds include, but are not limited to, 2-element compounds such as GaSb, InSb, InSe, $Sb_2Te_3$, and GeTe, 3-element compounds such as GeSbTe, GaSeTe, InSbTe, $SnSb_2Te_4$, and InSbGe, or 4-element compounds such as AgInSbTe, (GeSn)SbTe, GeSb(SeTe), and $Te_{81}Ge_{15}Sb_2S_2$.

The memory cells in a PRAM are called "phase change memory cells". A phase change memory cell typically comprises a top electrode, a phase change material layer, a bottom electrode contact, a bottom electrode, and an access transistor. A READ operation is performed on the phase change memory cell by measuring the resistance of the phase change material layer, and a PROGRAM operation is performed on the phase change memory cell by heating and cooling the phase change material layer as described above.

FIGS. 1A and 1B show circuit diagrams illustrating a conventional phase change memory cell with an MOS embodiment 10 and a conventional diode based embodiment 30. Referring to FIG. 1A, memory cell 10 includes a phase change resistance element 16 comprising a GST compound, and a N-type metal-oxide semiconductor (NMOS) transistor 18. The phase change resistance element 16 is connected between a Bit-line 12 and an NMOS transistor 18. The NMOS transistor 18 is connected between the phase change resistance element 16 and ground 22 (also called VSS). In addition, the NMOS transistor 18 has a gate connected to a Word-line 14. The NMOS transistor 18 is turned on in response to a voltage applied to the Word-line. When the NMOS transistor 18 is turned on, current flows from the Bit-line 12 through the phase change resistance element 16 and the NMOS transistor 18 to ground 22.

Referring to FIG. 1B, the memory cell 30 comprises a phase change resistance element 36 comprising a GST compound, connected to a Bit-line 32, and a diode 38 is connected between the phase change resistance element 36 and a Word-line 34. The phase change memory cell 30 is accessed by selecting the Word-line 34 and the Bit-line 32. In order for the phase change memory cell 30 to work properly, the Word-line 34 must have a voltage level lower than the Bit-line 32 by at least the built-in diode voltage of diode 38, so that current can flow through the phase change resistance element 36. To ensure that the Word-line 34 has a sufficiently lower voltage level than the Bit-line 32, the Word-line 34 is generally connected to ground when selected.

In FIGS. 1A and 1B, the phase change resistance elements 16 and 36 can alternatively be broadly referred to as "memory elements" and the NMOS transistor 18 and the diode 38 can alternatively be broadly referred to as "select elements".

The operation of the phase change memory cells 10 and 30 is described below with reference to FIG. 2. In particular, FIG. 2 is a graph illustrating temperature characteristics of the phase change resistance elements 16 and 36 during PROGRAM operations of the memory cells 10 and 30. In FIG. 2, a curve 52 shows the temperature characteristics of the phase change resistance elements 16 and 36 during a transition to the amorphous state, and a curve 54 shows the temperature characteristics of the phase change resistance elements 16 and 36 during a transition to the crystalline state.

Referring to FIG. 2, during a transition to the amorphous state, a current is applied to the GST compound in phase change resistance elements 16 and 36 for a duration T1 56 to increase the temperature of the GST compound above a melting temperature Tm 58. After the duration T1 56, the temperature of the GST compound is rapidly decreased, or "quenched", and the GST compound assumes the amorphous state. Conversely, in a transition to the crystalline state, a current is applied to the GST compound in the phase change resistance elements 16 and 36 for an interval T2 60 (where T2 is greater than T1) to increase the temperature of the GST compound above a crystallization temperature Tx 62. At T2, the GST compound is slowly cooled down below the crystallization temperature so that it assumes the crystalline state.

A phase change memory device typically comprises a plurality of phase change memory cells arranged in a memory cell array. Within the memory cell array, each of the memory cells is typically connected to a corresponding bit-line and a corresponding word-line. For example, the memory cell array may comprise bit-lines arranged in columns and word-lines arranged in rows, with a phase change memory cell located near each intersection between a column and a row.

Typically, a row of phase change memory cells connected to a particular word-line is selected by applying an appropriate voltage level to the particular word line. For example, to select a row of phase change memory cells similar to phase change memory cell 10 illustrated in FIG. 1A, a relatively high voltage level is applied to a corresponding word-line 14 to turn on the NMOS transistor 18. Alternatively, to select a row of phase change memory cells similar to the phase change memory cell 30 illustrated in FIG. 1B, a relatively low voltage level is applied to a corresponding word-line 34 so that current can flow through diode 38.

Unfortunately, where a PROGRAM current is simultaneously applied to the plurality of diode based memory cells connected with one word-line, a voltage level of the word-line may undesirably increase due to the parasitic resistance and parasitic capacitance of the word-line. As the voltage level of the word-line increases, the programming characteristics of the plurality of memory cells may deteriorate because the voltage across the memory element decreases resulting in less temperature rise in the memory element. In addition, if the voltage level of the word-line increases too much, the diode 38 shown in FIG. 1B can not sufficiently turn on.

One U.S. Pat. No. 7,463,511 granted to Choi et al. on Dec. 9, 2008 discloses one approach to minimizing the voltage level change on a sub-word-line, which is to use a sub-word-line driver on either end of the sub-word-line. In this approach, sub-word-line drivers are used on either end of a sub-word-line with parasitic resistance. Each memory cell sinks current from their respective write drivers, through column select transistors. The sink current develops a voltage across the parasitic resistance and the resistance of the NMOS devices in the sub-word-line drivers respectively. This approach suffers from a common ground line and associated resistance used by the sub-word-line drivers.

BRIEF SUMMARY

In one aspect, the invention features a method for improving sub-word line response comprising generating a variable substrate bias determined by at least one user parameter. The variable substrate bias is applied to a sub-word line driver in a selected sub-block of a memory. A voltage disturbance on a sub-word line in communication with the sub-word line driver is minimized by modifying a variable substrate bias of the sub-word line driver to change a transconductance of the sub-word line driver thereby.

In another aspect, the invention features an adaptable sub-word line driver comprising a sub-word line driver in communication with a plurality of memory cells in a memory. The sub-word line driver includes a transistor with a variable substrate bias voltage. A source of the transistor is in communication with a ground potential and a drain of the transistor is in communication with a sub-word line. The transistor is formed in a P-well and is in communication with the variable substrate bias voltage. A variable substrate bias voltage generator includes at least one resistor in series with a bias resistor. Each resistor is in parallel with a shunting transistor controlled by a trim value. The at least one resistor and the bias resistor divides a bias voltage to produce the variable substrate bias voltage.

In another aspect, the invention features a memory system comprising a plurality of sub-arrays of a memory. Each sub-array includes a plurality of memory cells in communication with at least one sub-word line driver. The at least one sub-word line driver of each sub-array is formed in a P-well and is in communication with a variable substrate bias voltage. A variable substrate bias voltage generator includes at least one resistor in series with a bias resistor. Each resistor is in parallel with a shunting transistor controlled by a trim value. The at least one resistor and the bias resistor divides a bias voltage to produce the variable substrate bias voltage. An address decoder selects one of the plurality of sub-arrays. The address decoder enables communication with the variable substrate bias voltage generator and the selected one of the plurality of sub-arrays.

BRIEF DESCRIPTION OF THE SEVERAL VIEWS OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 3:
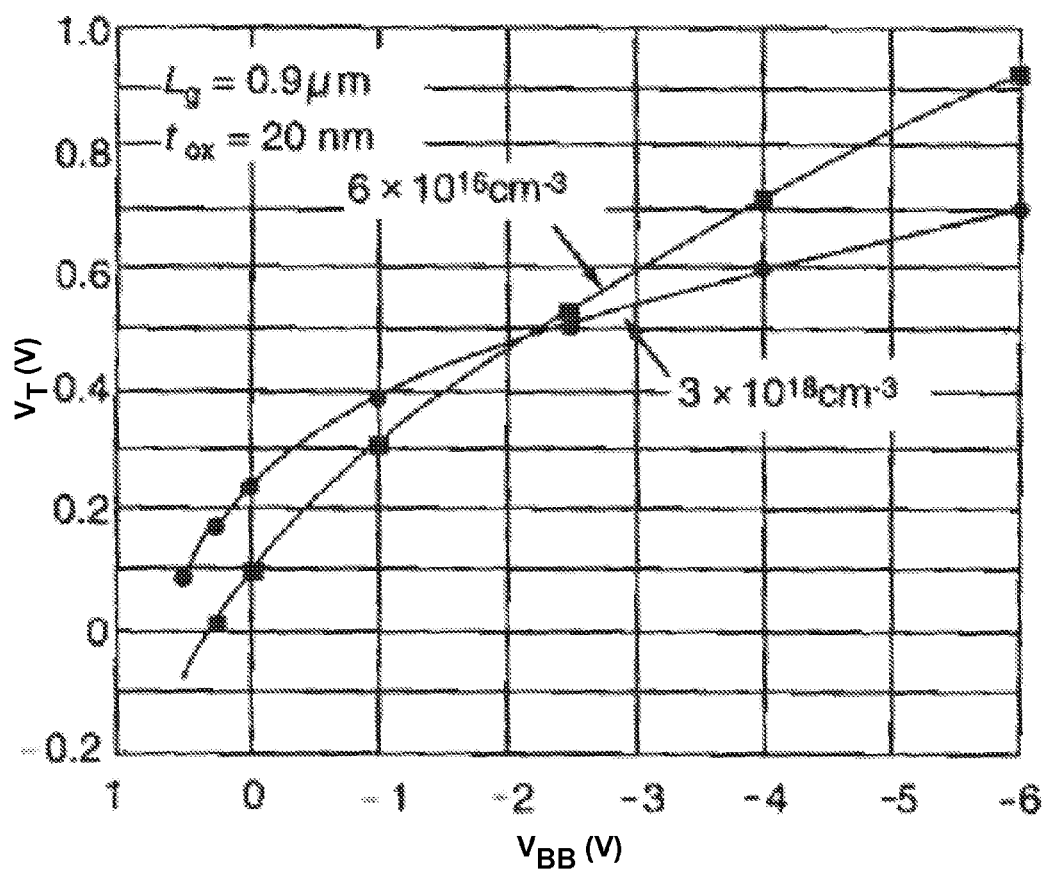
FIG. 3 is a graph view showing the relationship of substrate back-bias voltage to n-type metal oxide semiconductor (NMOS) threshold for two values of well doping concentrations.

FIG. 3 illustrates a substrate bias voltage (Vbb) versus threshold voltage (Vt) for a NMOS transistor as a function of the well doping-concentration. In accordance with embodiments of the present invention, proper adjustment of the substrate bias (or "back-bias") of the sub-word-line NMOS pull-down transistor reduces undesirable sub-word-line voltage increase in diode based PCM memories. Various embodiments are used in a multiprogramming method, wherein a number of simultaneously programmed memory cells is limited to prevent word line voltages from increasing undesirably. In one example, a method to resolve the problem of undesirable word-line voltage increase is to use a two-threshold level NMOS transistor, which is controlled by a dedicated separate P-well bias. NMOS threshold (Vt) is affected by a substrate voltage level (Vbb) as described in the following equation:

$$Vt = Vt0 + \gamma((2\phi b - Vbb)^{1/2} - (2\phi \beta)^{1/2})$$

Where Vbb is the substrate bias, Vt0 is the threshold voltage for Vbb=0 and γ is a constant that describes the substrate bias effect. The term φb is defined as follows:

$$\phi b = kT/q \ln(NA/Ni)$$

The term φb is the bulk potential, a term that accounts for the doping of the substrate. NA is the density of carriers in the doped semiconductor substrate, and Ni is the carrier concentration in intrinsic (e.g. undoped) silicon.

Figure 4:
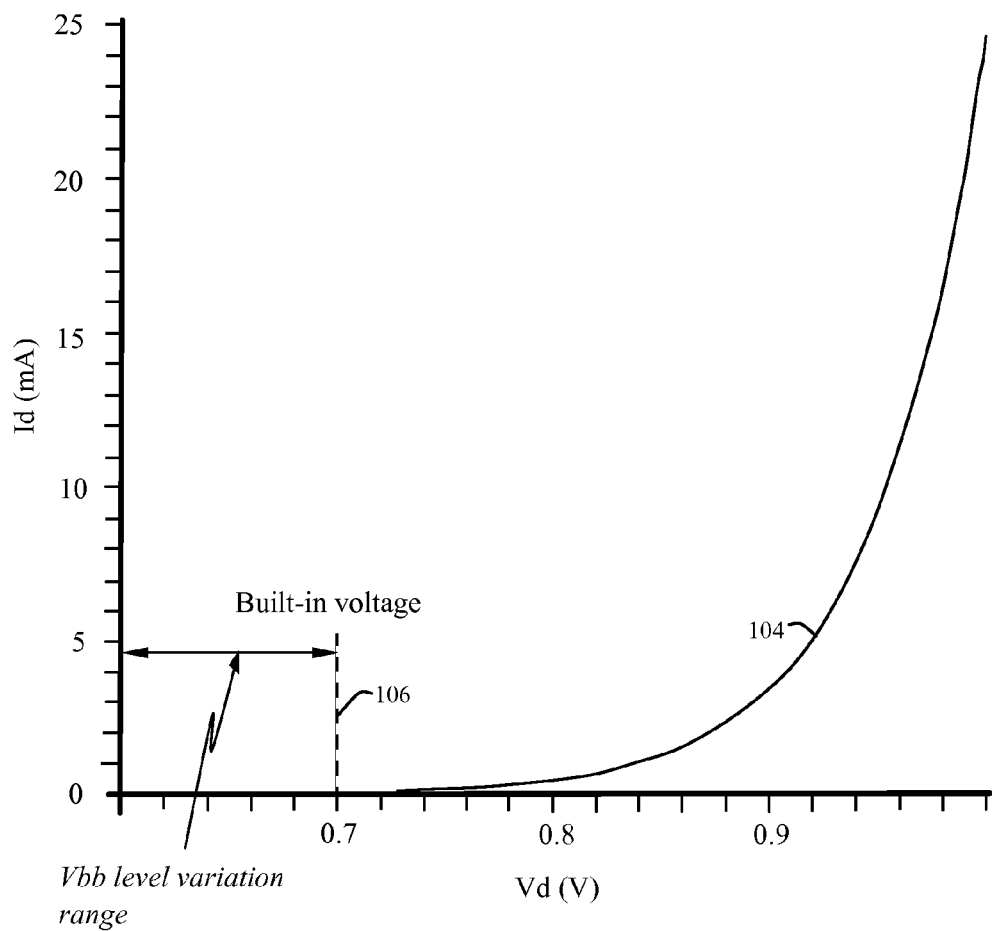
FIG. 4 is a graph view showing the relationship of voltage and current for a diode with emphasis on the built-in voltage.

FIG. 4 shows a current versus voltage curve 104 of a P-N diode, which is a part of an NMOS structure. For example, P-N diodes exist at the source to bulk and the drain to bulk interfaces. As described above, Vt is controlled by an electrically variable Vbb voltage level. In the case of a positive Vbb, a P-N diode can be forward biased, which is a cause of latch-up. Accordingly in the described embodiments, the maximum value of Vbb is limited to a level below the built-in diode voltage 106 to prevent latch-up.

Figures 1A, 1B:
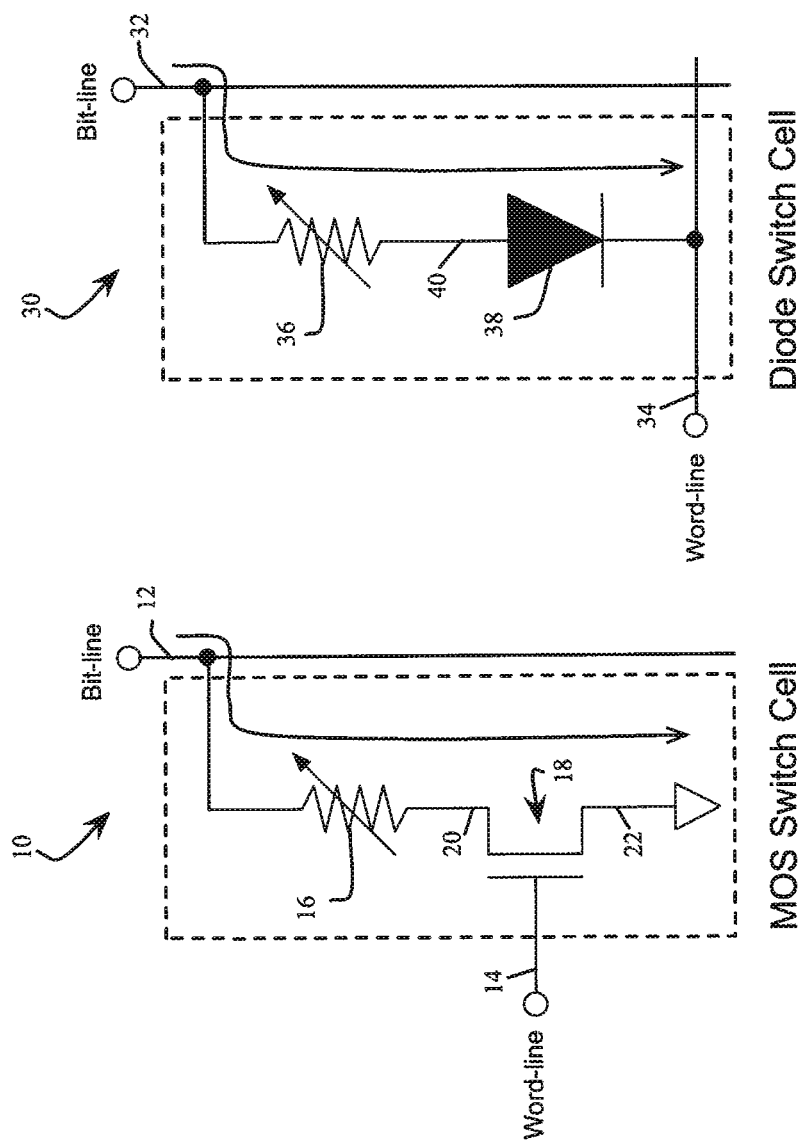
FIG. 1A is a schematic view of an MOS transistor-based phase change memory cell.
FIG. 1B is a schematic view of a diode-based phase change memory cell.
Figure 2:
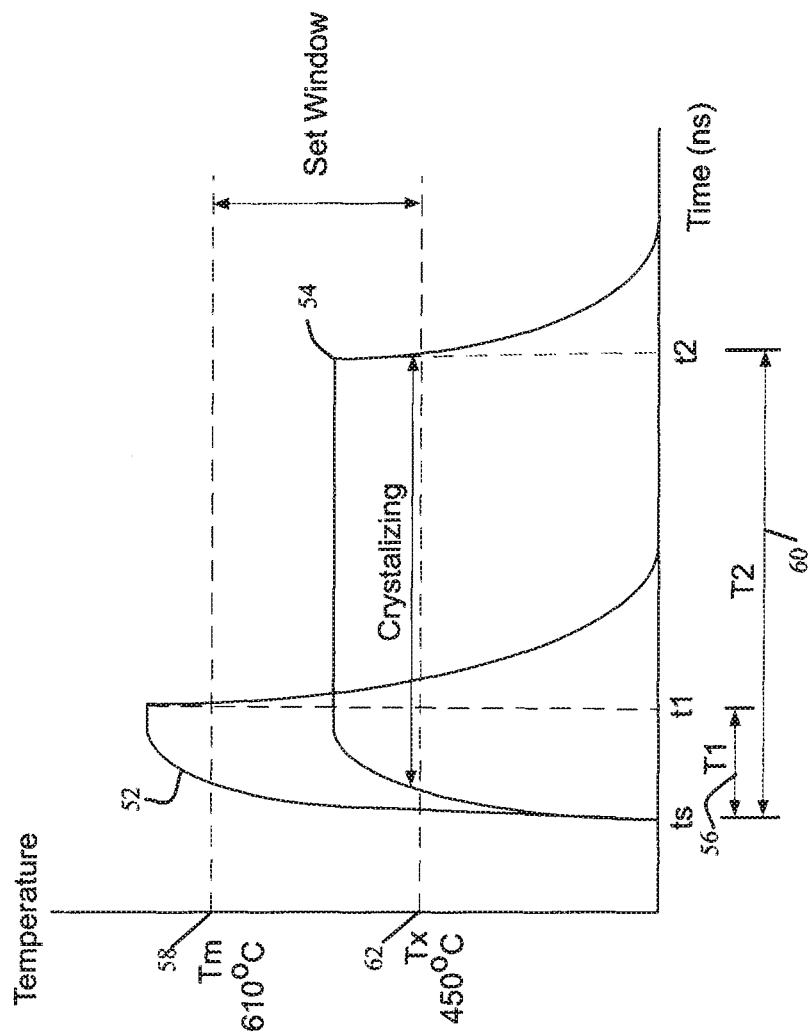
FIG. 2 is a graph of the temperature change during a SET and a RESET operation of a conventional PCM cell.

In one of the preferred embodiments, during a STANDBY operation when the sub-word-line is not selected, the sub-word-line driver substrate bias (e.g. Vbb) is set to Vss (e.g. ground or 0 volts). During a READ operation, the sub-word-line driver substrate bias is also set to Vss because less current is required to read the memory cell than to program it. Accordingly, less voltage increase occurs across the parasitic resistance of the sub-word-line and the sub-word-line driver. During a PROGRAM operation of either SET or RESET, the sub-word-line driver substrate bias is set between 0.1 volts and 0.69 volts in one embodiment. More current is required to be passed through the memory cells during a PROGRAM operation than a READ operation because programming requires the memory element 16 or 36 in FIGS. 1A and 1B respectively to be heated up above the melting temperature 58 required for a RESET or the crystallizing temperature 62 required for a SET operation as shown in FIG. 2.

Figure 5A:
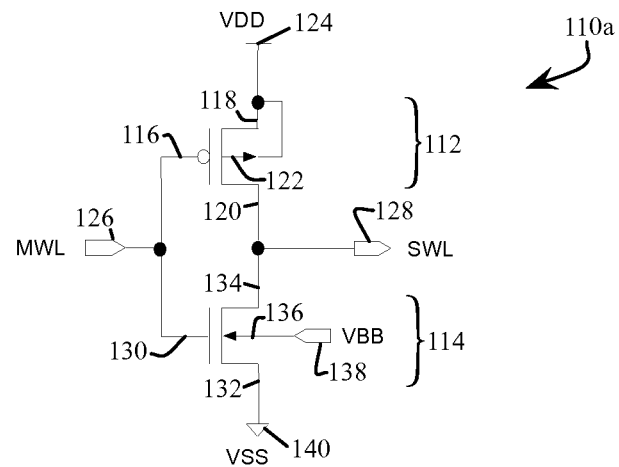
FIG. 5A is a schematic view of a sub-word line driver according to an embodiment of the invention.
Figure 5B:
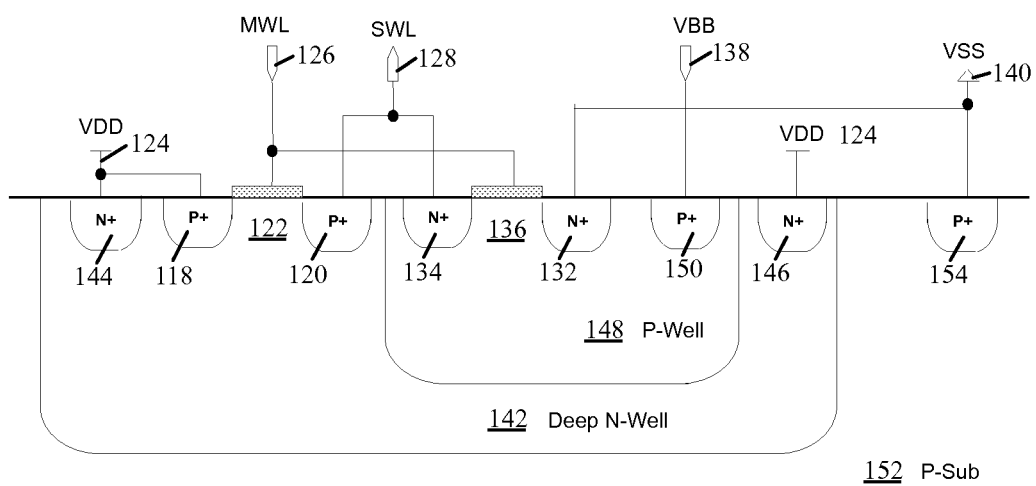
FIG. 5B is a cross section view of the sub-word line driver fabricated in a semiconductor.

With reference to FIGS. 5A and 5B, a separate substrate bias is applied to the P-well of the sub-word-line drivers with a triple well structure. This triple well structure permits the NMOS transistor of the sub-word-line driver to be electrically isolated from the bulk substrate (P-sub) with a bias set to Vss. Specifically, in FIG. 5A the sub-word-line driver 110a has a PMOS pull-up transistor 112 with a source 118, a gate 116, a drain 120 and a bulk 122. The source 118 is connected to VDD 124, the gate 116 is connected to the master word-line 126, the drain 120 is connected to the sub-word-line 128 and the bulk 122 is connected to VDD 124. The sub-word-line driver 110a also has an NMOS pull-down transistor 114 with a source 140, a gate 130, a drain 134 and a bulk 136. The source 132 is connected to VSS 140, the gate 130 is connected to the master word-line 126, the drain 134 is connected to the sub-word-line 128 and the bulk 136 is connected to the variable substrate bias VBB 138.

In FIG. 5B, the corresponding source, gate, drain and bulk connections shown in FIG. 5A are shown. In addition, the bulk substrate 152 doped with a P-type dopant is isolated from the Deep N-well 142 with a reverse bias formed by the low impedance connections 154 and 146 respectively. The connection 154 is a low impedance connection to the P-sub 152 because it is of the same dopant type (e.g. P-type) but with a high dopant concentration. Similarly, the connection 150 forms a low impedance connection to the P-Well 148. The P-Well 148 is reversed bias with respect to the Deep N-well 142 by virtue of the P-Well 148 connection to VBB 138 and the Deep N-well 142 connection to VDD 124. By this device structure, the P-well into the Deep N-well is electrically isolated from the P-sub, which is connected to VSS 140.

Figure 6:
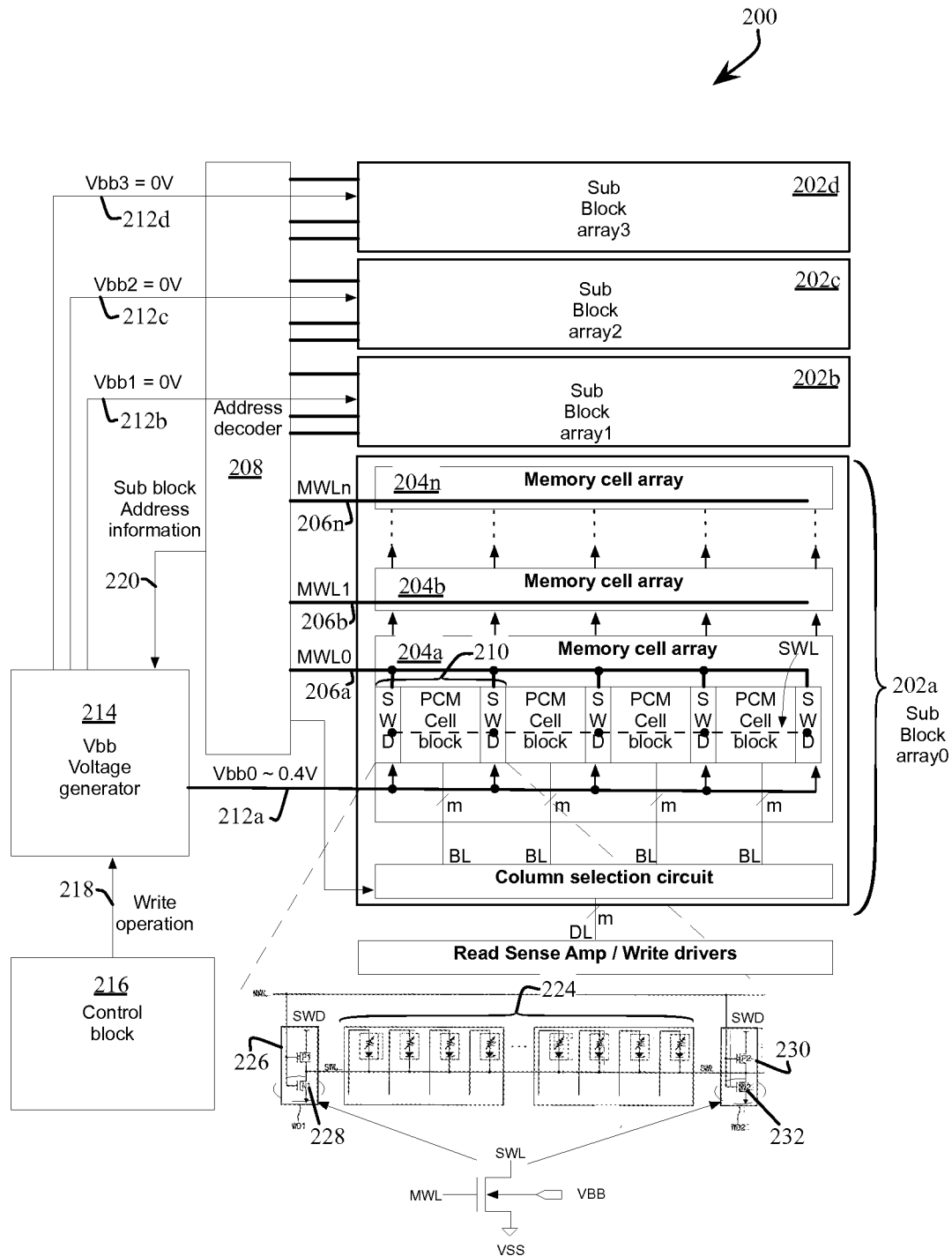
FIG. 6 is a schematic view of a memory architecture according to an embodiment of the invention.

Due to semiconductor patterning limitations, every sub-word-line driver cannot have an individual Vbb substrate bias. Specifically, the spacing between P-wells 148 is limited due to the possibility of one P-well 148 "punch-through" or shorting to another P-well 148 in the same Deep N-Well 142. Punch-through occurs when the "space charge region" at the boundary of one P-Well and the Deep N-Well, formed by the applied reverse bias, meets the space charge region of another P-Well. Accordingly, an architecture with shared Vbb connections is required, as shown in FIG. 6. With reference to the embodiment 200 shown in FIG. 6, the memory is divided into four sub-array blocks 202a, 202b, 202c and 202d (generally 202). Each sub-array 202 is further divided into a plurality of memory cell arrays 204a through 204n (generally 204), each cell array 204 including a plurality of PCM cell blocks 210 bounded by two sub-word-line drivers 226 and 230. Each sub-word-line driver 226 and 230 has an NMOS pull-down transistor 228 and 232 respectively. Each of the memory cell arrays 204 is addressed by an address decoder 208 with master word-lines 206a through 206n (generally 206) corresponding to memory cell arrays 204a through 204n. Each master word-line is connected to a plurality of sub-word-lines, with each sub-word-line driven by two sub-word-line drivers. Each sub-array block 202 has a separate substrate bias Vbb 212a through 212d corresponding to sub-blocks 202a through 202d respectively. Each substrate bias Vbb is generated by a voltage generator 214, which is enabled during a write operation 218 by control block 216. Other architectures with isolated substrate bias control are envisioned, with sufficient granularity (or partitioning) of the memory cells to minimize the loading and size of the substrate bias generator, but without unduly increasing the overall memory system area due to the aforementioned spacing limitations between P-Wells.

Figure 7:
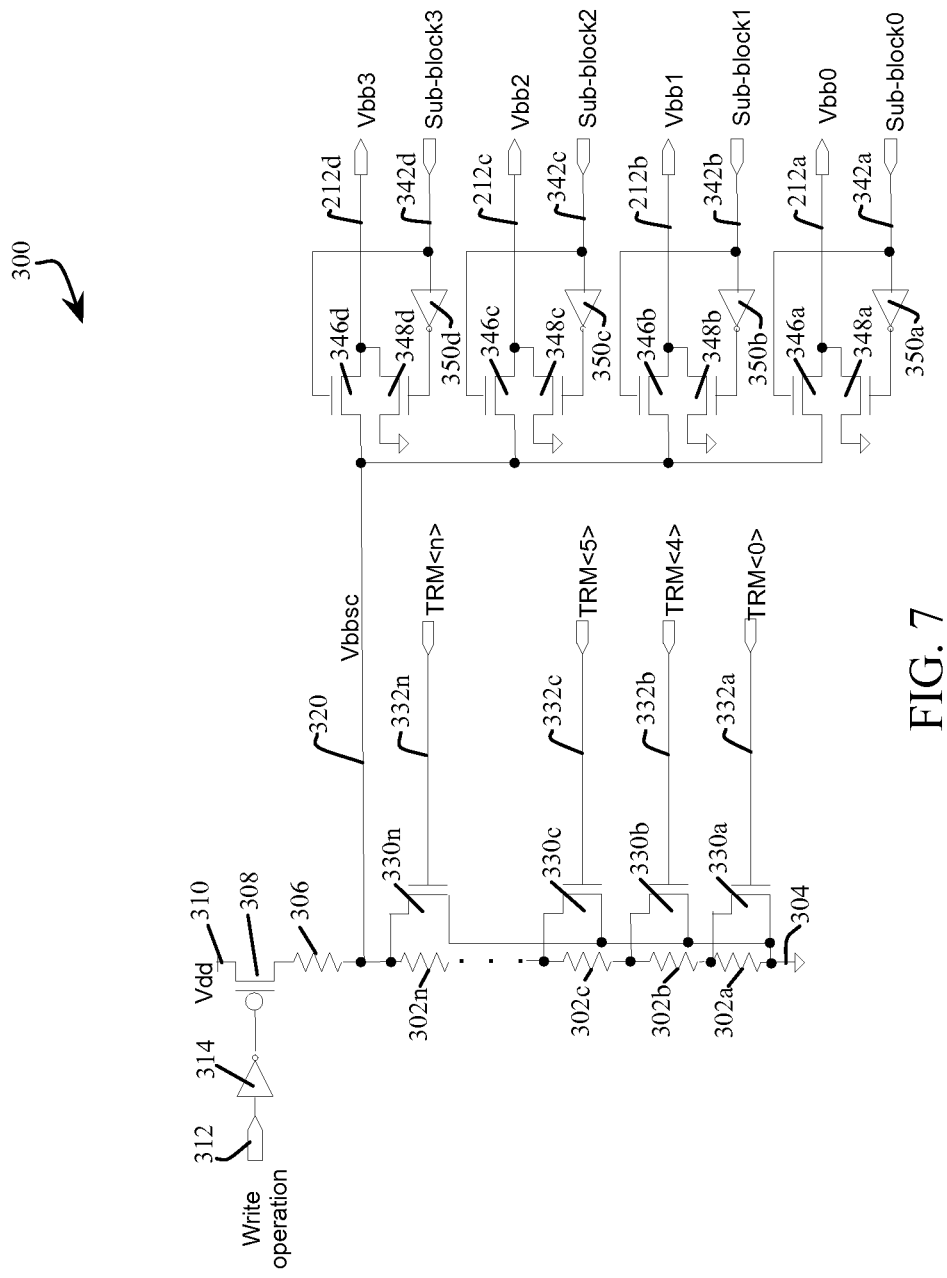
FIG. 7 is a schematic view of a substrate back-bias generator according to an embodiment of the invention.

An embodiment 300 of the substrate bias generator Vbb is shown in more detail in FIG. 7. In one of the preferred embodiments, the Vbb generator uses a resistor chain to reduce the complexity and improve the voltage controllability over a generator based on a charge pump. Specifically, a chain of resistors 302a, through 302n (generally 302) is in series with a bias resistor 306. The chain of resistors 302 and the bias resistor is enabled by the PMOS transistor 308 with source connected to VDD 310 and the gate connected to the Write operation signal 312 through an inverter 314. The chain of resistors 302 divides the VDD voltage 310 with the bias resistor 306 to create the variable substrate bias voltage Vbbsc 320. The Vbbsc voltage 320 is routed to one of the sub-array blocks 202a, 202b, 202c and 202d shown in FIG. 6 with Sub-block control signals 342a, 342b, 342c and 342d respectively. For example, the substrate bias voltage 320 is routed to a sub-array block 202a through transistor 346a shown in FIG. 6 by activating Sub-block0 342a. The remaining sub-array blocks 202b, 202c and 202d will have a substrate bias set to VSS through transistors 348b, 348c and 348d respectively.

The substrate bias generator shown in FIG. 7 can be trimmed to provide many values of Vbbsc 320 between the range of 0 volts and 0.69 volts. Each of the resistors 302a through 302n (generally 302) has a transistor 330a through 330n with a gate controlled by trim values 332a through 332n (generally 332) respectively. An example of trim values 332 and the resulting substrate bias voltage 320 is as follows:

Trim<6>=Vdd, others=Vss; Vbbsc=Vss
Trim<5>=Vdd, others=Vss, Vbbsc=0.1V
Trim<4>=Vdd, others=Vss, Vbbsc=0.2V
Trim<3>=Vdd, others=Vss, Vbbsc=0.3V
Trim<2>=Vdd, others=Vss, Vbbsc=0.4V
Trim<1>=Vdd, others=Vss, Vbbsc=0.5V
Trim<0>=Vdd, others=Vss, Vbbsc=0.6V Activation of a combination of several trim values 332 results in numerous values of Vbbsc 320 from 0 volts to 0.69 volts. In one of the preferred embodiments, the Vbbsc 320 voltage level is substantially 0.4 volts. In another embodiment, more than seven trim values 332 corresponding to more than seven resistors 302 are used to provide finer granularity of Vbbsc values. In one example, the trim values are held in a user programmable register. In another example, the trim values are programmed with fusible links or ROM code during final component test.

The trim values are set based on a variety of parameters including the substrate doping, the number of concurrently programmed memory cells, the address of the memory cells and the array configuration, for example. In the case of setting the trim values based on substrate doping, in-line wafer testing or wafer acceptance test data is used to determine the maximum Vbb value that can be used without resulting in a threshold (Vt as shown in FIG. 3) that will exceed the built-in voltage 106 (as shown in FIG. 4). In the case of setting the trim values based on the number of concurrently programmed memory cells, the user can dynamically change the word width (and consequently the number of concurrently programmed memory cells) during memory operation and change the trim value accordingly. For example, if a larger word width is written, a trim value is selected to set Vbbsc closer to the upper limit, or 0.69 volts to minimize the sub-word-line voltage change resulting from additional current being sunk by the sub-word-line. In the case of setting the trim value based on the address of the memory cells, a trim value is selected to set Vbbsc closer to the upper limit when a memory cell address corresponds to a sub-word-line driver with a higher resistance connection to Vss. This can occur with sub-word-line drivers that are in the center of the memory array, further removed from wider (and thus lower resistance) Vss connections at the boundary of a memory system. In the case of setting a trim value based on an array configuration, a memory can be synthesized with different aspect ratios (e.g. height versus width) yet with the same data input and output width to accommodate different floor-planning constraints in an integrated circuit. In this case, the sub-word-line can have more memory cells read concurrently than if the memory is physically narrower (with a corresponding change in column decoding to maintain the same data input and output width). When the sub-word-line sinks more current from more memory cells concurrently programmed, the Vbbsc value is set closer to 0.69V.

Figure 8:
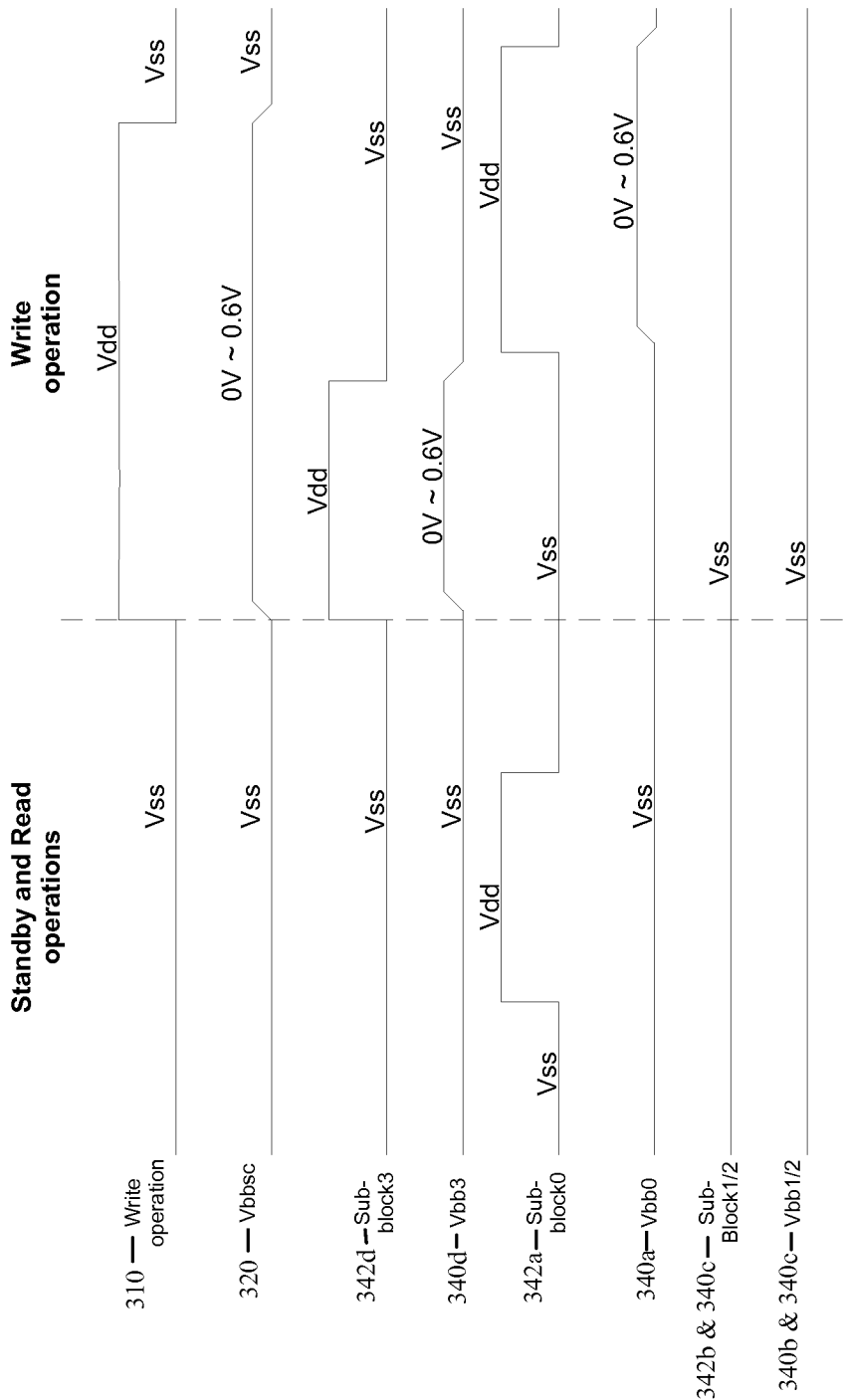
FIG. 8 is a timing diagram of Standby, Read and Write operations according to an embodiment of the invention.

With reference to FIG. 8 the timing and activation of the variable substrate bias is explained. During the STANDBY and READ operations, the PMOS transistor 308 shown in FIG. 7 is shut off. With no current flowing through transistor 308, the Vbbsc node discharges to Vss 304 through the resistor chain 302. Accordingly, any selected sub-array block 202 will have a substrate bias set to Vss. During a WRITE operation (e.g. RESET or SET operation), the PMOS transistor 308 is turned on and the Vbbsc voltage level will be determined by the trim value settings. The selected sub-array block will have a substrate bias of Vbbsc communicated through one of the select transistors 346a, 346b, 346c and 346d.

In the embodiments described above, the device elements and circuits are connected to each other as shown in the figures, for the sake of simplicity. In practical applications of the present invention, elements, circuits, etc. may be connected directly to each other. As well, elements, circuits etc. may be connected indirectly to each other through other elements, circuits, etc., necessary for operation of devices and apparatus. Thus, in actual configuration, the circuit elements and circuits are directly or indirectly coupled with or connected to each other.

The above-described embodiments of the present invention are intended to be examples only. Alterations, modifications and variations may be effected to the particular embodiments by those of skill in the art without departing from the scope of the invention, which is defined solely by the claims appended hereto.

While the invention has been shown and described with reference to specific preferred embodiments, it should be understood by those skilled in the art that various changes in form and detail may be made therein without departing from the spirit and scope of the invention as defined by the following claims.

What is claimed is:

1. A method for improving sub-word line response comprising:
   generating a variable substrate bias determined by at least one user parameter;
   applying the variable substrate bias to a sub-word line driver in a selected sub-block of a memory; and
   minimizing voltage disturbance on a sub-word line in communication with the sub-word line driver by modifying a variable substrate bias of the sub-word line driver to change a transconductance of the sub-word line driver thereby.

2. The method of claim 1 wherein generating the variable substrate bias includes shunting at least one resistor based on a trim value, each resistor being in series with a bias resistor and dividing a voltage.

3. The method of claim 1 wherein the at least one user parameter is a number of a plurality of memory cells in communication with the sub-word line.

4. The method of claim 1 wherein the at least one user parameter is an address of a plurality of memory cells in communication with the sub-word line.

5. The method of claim 1 wherein the at least one user parameter is an array configuration of a memory comprising a plurality of memory cells in communication with the sub-word line.

6. An adaptable sub-word line driver comprising:
   a sub-word line driver in communication with a plurality of memory cells in a memory, the sub-word line driver including a transistor with a variable substrate bias voltage, a source of the transistor being in communication with a ground potential and a drain of the transistor in communication with a sub-word line, the transistor being formed in a P-well and being in communication with the variable substrate bias voltage; and
   a variable substrate bias voltage generator including at least one resistor in series with a bias resistor, each resistor being in parallel with a shunting transistor controlled by a trim value, the at least one resistor and the bias resistor dividing a bias voltage to produce the variable substrate bias voltage.

7. The adaptable sub-word line driver of claim 6 wherein the variable substrate bias voltage is greater than or equal to 0 volts and less than or equal to 0.69 volts.

8. The adaptable sub-word line driver of claim 6 wherein the variable substrate bias voltage is substantially equal to 0.4 volts.

9. The adaptable sub-word line driver of claim 6 wherein the trim value is user programmable.

10. The adaptable sub-word line driver of claim 6 wherein the trim value depends on a number of the plurality of memory cells to be programmed.

11. The adaptable sub-word line driver of claim 6 wherein the trim value depends on an address of the plurality of memory cells to be programmed.

12. The adaptable sub-word line driver of claim 6 wherein the trim value depends on an array configuration of the memory.

13. A memory system comprising:
- a plurality of sub-arrays of a memory, each sub-array including a plurality of memory cells in communication with at least one sub-word line driver, the at least one sub-word line driver of each sub-array being formed in a P-well and being in communication with a variable substrate bias voltage;
- a variable substrate bias voltage generator including at least one resistor in series with a bias resistor, each resistor being in parallel with a shunting transistor controlled by a trim value, the at least one resistor and the bias resistor dividing a bias voltage to produce the variable substrate bias voltage; and
- an address decoder selecting one of the plurality of sub-arrays, the address decoder enabling communication with the variable substrate bias voltage generator and the selected one of the plurality of sub-arrays.

14. The system of claim 13 wherein the variable substrate bias voltage is greater than or equal to 0 volts and less than or equal to 0.69 volts.

15. The system of claim 13 wherein the variable substrate bias voltage is substantially equal to 0.4 volts.

16. The system of claim 13 wherein the trim value is user programmable.

17. The system of claim 13 wherein the trim value depends on a number of the plurality of memory cells to be programmed.

18. The system of claim 13 wherein the trim value depends on an address of the plurality of memory cells to be programmed.

19. The system of claim 13 wherein the trim value depends on an array configuration of the memory.

20. The system of claim 13 wherein the memory is a phase change memory.

* * * * *